United States Patent
Damlencourt et al.

(10) Patent No.: US 7,030,043 B2
(45) Date of Patent: Apr. 18, 2006

(54) PROCESS FOR DEPOSITION OF A THIN LAYER ON AN OXIDIZED LAYER OF A SUBSTRATE

(75) Inventors: Jean-Francois Damlencourt, Saint-Egreve (FR); Olivier Renault, Saint-Pancrasse (FR)

(73) Assignee: Commissariat a L'Energie Atomique, Paris (FR)

( * ) Notice: Subject to any disclaimer, the term of this patent is extended or adjusted under 35 U.S.C. 154(b) by 0 days.

(21) Appl. No.: 11/104,577

(22) Filed: Apr. 13, 2005

(65) Prior Publication Data

US 2005/0239298 A1 Oct. 27, 2005

(30) Foreign Application Priority Data

Apr. 27, 2004 (FR) .................................. 04 04461

(51) Int. Cl.
*H01L 21/469* (2006.01)
*H01L 21/8242* (2006.01)

(52) U.S. Cl. ...................................... 438/785; 438/240

(58) Field of Classification Search ................ 438/785, 438/240, 680, 608
See application file for complete search history.

(56) References Cited

U.S. PATENT DOCUMENTS

| 6,958,302 B1 * | 10/2005 | Ahn et al. .................. 438/785 |
| 2002/0190294 A1 | 12/2002 | Iizuka et al. |
| 2004/0023461 A1 | 2/2004 | Ahn et al. |
| 2004/0025787 A1 | 2/2004 | Selbrede et al. |

(Continued)

OTHER PUBLICATIONS

Takaaki Kawahara et al.; "Effect of Purge Time on the Properties of $HfO_2$ Films Prepared by Atomic Layer Deposition"; Ieice Trans. Electron; vol. E87-C, No. 1; Jan. 2004; pp 2-8.

(Continued)

*Primary Examiner*—Michael Trinh
(74) *Attorney, Agent, or Firm*—Oliff & Berridge, PLC

(57) ABSTRACT

A thin layer comprising at least a metal and a non-metallic chemical element is deposited on an oxidized layer of a substrate arranged in a reactor. The thin layer is formed by a plurality of superposed atomic layers formed by repetition of a reaction cycle comprising at least a first step of injecting a first halogenated metallic reagent into the reactor, a first reactor purging step, a second step of injecting a second reagent comprising the non-metallic chemical element into the reactor and a second reactor purging step. The process comprises, after each deposition of an atomic layer, at least one densification sequence of the atomic layer comprising a third purging step, an additional injection step of the second reagent and a fourth purging step. The time length of a densification sequence is substantially longer than the time length of a reaction cycle.

11 Claims, 8 Drawing Sheets

U.S. PATENT DOCUMENTS

2004/0043630 A1  3/2004  Vaartstra et al.
2004/0171280 A1* 9/2004  Conley et al. .............. 438/785

OTHER PUBLICATIONS

M.- H. Cho et al.; "Thermal stability and structural characteristics of HfO2 films on Si (100) grown by atomic-layer deposition"; Applied Physics Letter, vol. 81, No. 3; Jul. 15, 2002; pp 472-474.

G.D. Wilk et al.; "High-K gate dielectrics: Current Status and materials properties considerations"; Journal of Applied Physics; vol. 89, No. 10; May 15, 2001; pp 5243-5275.

J.- F. Damlencourt et al.; "Electrical and physico-chemical characterization of $HfO_2/SiO_2$ gate oxide stacks prepared by atomic layer deposition"; Solid State Electronics, 47 (2003), pp 1613-1616.

* cited by examiner

PROCESS FOR DEPOSITION OF A THIN LAYER ON AN OXIDIZED LAYER OF A SUBSTRATE

BACKGROUND OF THE INVENTION

The invention relates to a process for deposition of a thin layer comprising at least a metal and a non-metallic chemical element on an oxidized layer of a substrate arranged in a reactor, the thin layer being formed by a plurality of superposed atomic layers, formed by repetition of a reaction cycle comprising at least the following successive steps:
- a first step of injecting a first halogenated metallic reagent into the reactor,
- a first reactor purging step,
- a second step of injecting a second reagent comprising the non-metallic chemical element into the reactor,
- a second reactor purging step.

STATE OF THE ART

To obtain micro-devices with high performance, high speed and low consumption, it is increasingly necessary to integrate a maximum amount of micro-components, such as field-effect transistors for example of MOS type, on a single chip. However, to keep a capacitive coupling as high as possible, reduction of the surface dimensions of each micro-component must result in a reduction of the thickness of the gate oxide deposited on the substrate.

The gate oxide the most widely used in the field of microelectronics is silicon oxide, formed by oxidation of the silicon substrate. It in fact presents the advantage of being perfectly compatible with the substrate and of being a suitable interface, from the physical, chemical and electrical standpoint, for the micro-components designed to be integrated on the substrate. However, the necessity of reducing the thickness of the gate oxide is not compatible with the use of silicon oxide as insulator. The leakage currents obtained in a gate oxide having a thickness of less than 1.5 nm are too high.

To remedy these shortcomings, it has been proposed to replace silicon oxide by materials having a higher dielectric constant K, called high dielectric constant materials or "High K" materials.

Indeed, if to produce a transistor enabling a capacitive coupling C, the silicon oxide gate oxide has to have a predetermined thickness, by replacing the silicon oxide by a High K material presenting a dielectric constant $k_2$ higher than that of silicon oxide ($k_1$=3.9), the thickness e of the gate oxide can be increased by a factor $k_2/k_1$. The thickness e of the layer is also called physical thickness whereas the equivalent oxide thickness EOT can be called electrical thickness and corresponds to the following formula: $EOT=(k_1/k_i) \times e_i$, where $k_i$ and $e_i$ are respectively the dielectric constant and the physical thickness of an oxide layer of nature i and where $k_1$ corresponds to the dielectric constant of silicon oxide.

The EOT is therefore a value enabling the physical thicknesses of silicon oxide and of an oxide of different nature to be compared, for an equivalent capacitive coupling, i.e. having a dielectric constant different from that of silicon oxide. This value also makes it possible to compare the capacitive coupling of two capacitors of identical surface, with an identical physical thickness, respectively with silicon oxide and an oxide of different nature as gate insulator. Replacing silicon oxide by a High K material therefore enables a gate oxide of larger thickness to be achieved while keeping the same equivalent oxide thickness value (EOT).

Integration of a High K material must, however, be suited to the fabrication process of field-effect transistors using silicon oxide as gate oxide. Thus, the High K material must be perfectly compatible with the substrate, generally made from silicon, and it must, more particularly, be thermodynamically and thermally stable.

G. D. Wilk et al., in the article "High-K gate dielectrics: Current status and materials properties considerations" (Journal of Applied Physics, Vol 89, n° 10, 15 May 2001, pages 5243 to 5275), studied the different High K materials capable of replacing silicon oxide. They propose using metal oxides of the IVB group, such as $TiO_2$, $ZrO_2$ and $HfO_2$, instead of silicon oxide.

Such metal oxides are advantageously deposited on a substrate sensitive to oxidation, such as silicon or germanium, by a deposition process of ALD type (Atomic Layer Deposition). The ALD process in fact consists in performing successive depositions of atomic layers, at low temperature, which enables possible reactions between the metal oxide and substrate to be limited. Thus, as illustrated in FIG. 1, ALD type deposition of a thin layer of hafnium oxide, $HfO_2$, on a silicon substrate is performed by repetition of a reaction cycle. The reaction cycle successively comprises a step of injecting a halogenated metallic precursor, for example $HfCl_4$, into the reactor, a first reactor purging step, a step of injecting water into the reactor and finally a second reactor purging step (FIG. 4). The reaction cycle is generally repeated until a thin layer of $HfO_2$ with a predetermined thickness is obtained, then the thin layer in most cases is subjected to an annealing step designed to stabilize the thin layer thermodynamically.

The ALD process, however, implies that the substrate surface comprises nucleation sites enhancing metallic precursor adsorption. These nucleation sites are, in the case of deposition of High K material oxide, "—OH" hydroxide groups and are in practice obtained by means of an oxidized interfacial layer, also called interfacial oxide layer and comprising one or more monolayers.

However the use of chlorinated reagents during the reaction cycles and the necessity of performing an annealing step after deposition lead to an increase of the oxidized interfacial layer as indicated in the article "Thermal stability and structural characteristics of $HfO_2$ films on Si(100) grown by atomic-layer deposition" by M.-H. Cho et al. (Applied Physics Letters, Vol. 81, N° 3, pages 472 to 474, 15 Jul. 2002). However, the growth phenomenon of the interfacial layer, also called interfacial layer regrowth phenomenon, means that the benefits obtained by using the High K material are lost.

J. F Damlencourt et al., in the article "Electrical and physico-chemical characterization of $HfO_2/SiO_2$ gate oxide stacks prepared by atomic layer deposition" (Solid State Electronics, 47 (2003), 1613–1616), studied the interfacial layer growth phenomenon following annealing after deposition. They indicate that the interfacial layer growth can be limited by controlling certain parameters of the annealing step, in particular by performing annealing at high temperature and under nitrogen. They also mention the fact that by performing shorter water injection steps, at each reaction cycle of the deposition process, it is possible to reduce the thickness of the interfacial layer and to improve the value of the EOT of the $HfO_2$ layers, after annealing. These means are, however, not sufficient to control the interfacial layer regrowth phenomenon satisfactorily.

OBJECT OF THE INVENTION

The object of the invention is to provide a process for deposition of a thin layer on an oxidized layer of a substrate, by "ALD" type deposition enabling the oxidized interfacial layer growth phenomenon to be controlled efficiently.

According to the invention, this object is achieved by the fact that the deposition process comprises, after each deposition of an atomic layer, at least one densification sequence comprising a third purging step, an additional injection step of the second reagent and a fourth purging step.

According to a development of the invention, the time length of a densification sequence is substantially longer than the time length of a reaction cycle.

According to another development of the invention, the time lengths of each purging step and of the additional injection step of a sequence are substantially longer than the respective time lengths of each purging step and of the second injection step of a reaction cycle.

According to a preferred embodiment, the time length of the additional injection step is comprised between 300 milliseconds and 1000 milliseconds whereas the time length of the second injection step is comprised between 50 milliseconds and 100 milliseconds.

According to another feature of the invention, the time length of the third and fourth purging steps is about a few seconds whereas the time length of the first and second purging steps is about a few hundred milliseconds.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

An atomic layer deposition process, also called "ALD" process, enables a plurality of superposed atomic layers to be deposited in a tightly sealed reactor on a substrate sensitive to oxidation. The atomic layers, also called monolayers, are identical and constitute a thin layer of predetermined thickness. They comprise at least a metal and a non-metallic chemical element such as oxygen. The metal is for example selected from the group consisting of hafnium, zirconium, titanium, yttrium, praseodymium and lanthanum. The thin layer is preferably formed by a metal oxide having a high dielectric constant, for example $HfO_2$, $ZrO_2$ or $TiO_2$.

Figure 1:
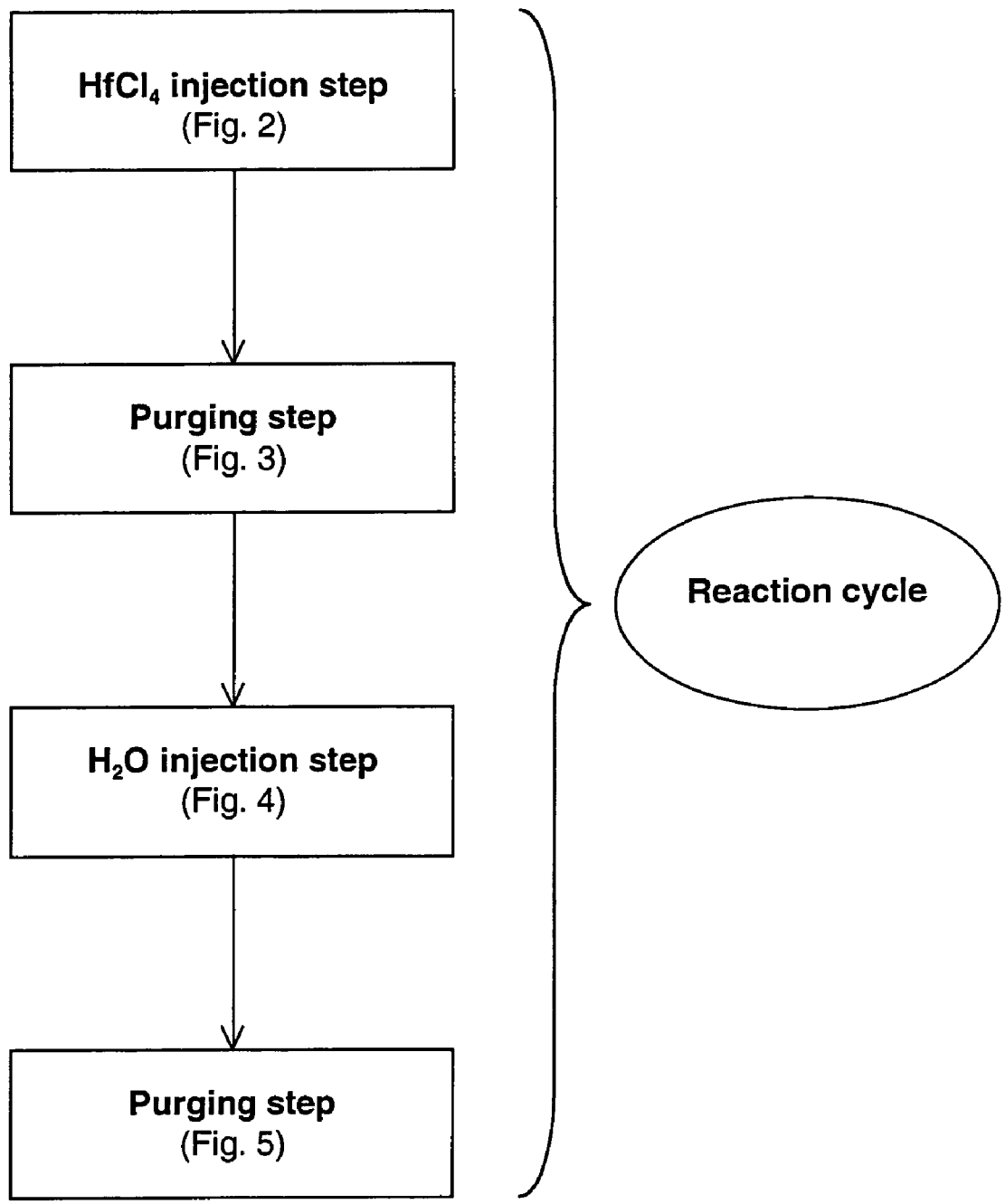
FIG. 1 schematically represents the different steps of a reaction cycle according to the prior art.

The atomic layers are formed by repetition of a reaction cycle according to the prior art, as represented in FIG. 1. For example purposes, FIGS. 2 to 5 illustrate the principle of the different steps of the reaction cycle theoretically enabling deposition of an atomic layer of $HfO_2$ to be obtained on a silicon substrate 1. To perform deposition, the substrate 1 is placed in a tightly sealed reactor 2 and it comprises on its surface an oxidized layer 3 of $SiO_2$ designed to receive the atomic layer of $HfO_2$ and also called interfacial layer.

A first halogenated metallic reagent 4, for example $HfCl_4$ in the case of deposition of an atomic layer of $HfO_2$, is injected into the reactor 2 (FIG. 2) for a period or a time length of 50 to 100 milliseconds. The metal 5, Hf, deposits and then reacts with the surface of the oxidized layer 3.

Figure 2:
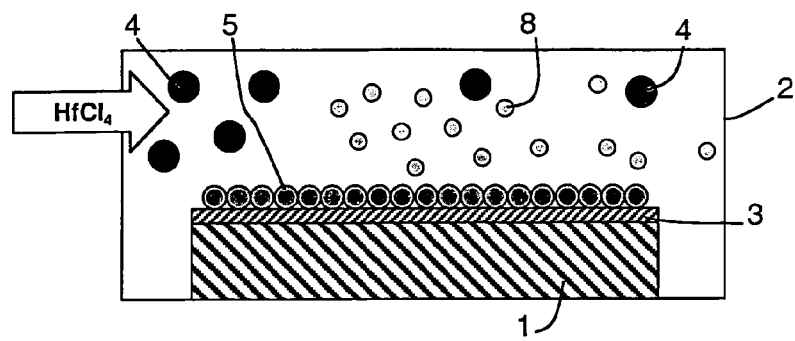
FIGS. 2 to 5 are schematic cross-sectional representations of a reactor, respectively in a $HfCl_4$ injection step, in a purging step, in a $H_2O$ injection step and in a purging step of a reaction cycle according to the prior art.
Figure 3:
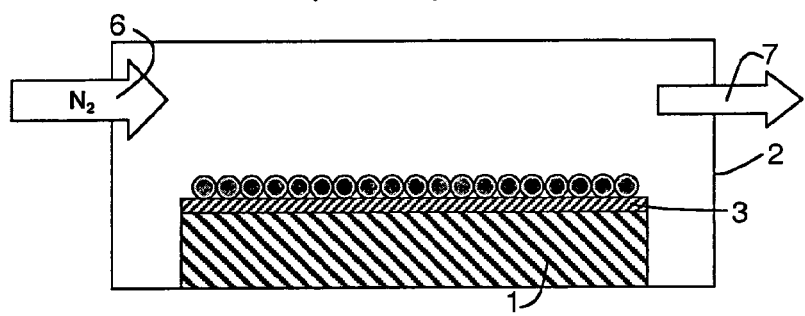

Once the $HfCl_4$ injection step is terminated, the reactor is purged by passing a nitrogen flow through the reactor for a few hundred milliseconds. Thus, in FIG. 3, the admission of nitrogen into the reactor 2 is represented by the arrow 6 entering the reactor 2 whereas removal of the nitrogen is represented by the arrow 7 leaving the reactor 2. This purging step enables the excess reagent 4 and the gaseous reaction products 8 to be eliminated (FIG. 2).

Figure 4:
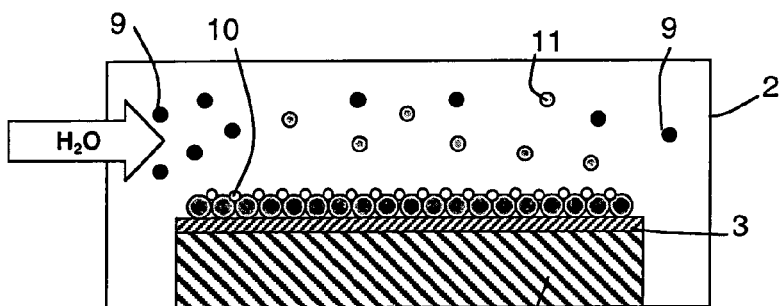
Figure 5:
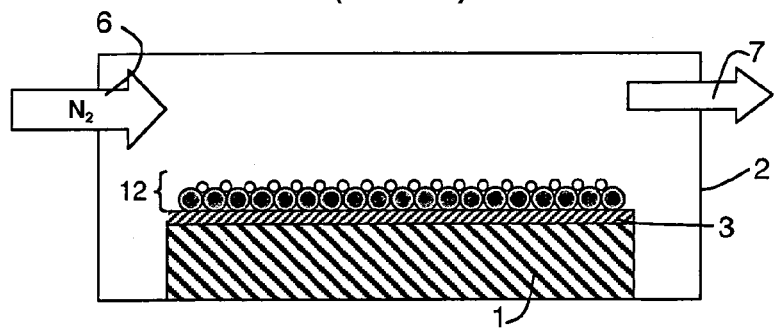

Then, as represented in FIG. 4, a second reagent 9, water in the case of an atomic layer of $HfO_2$, is injected into the reactor 2 so that the non-metallic element 10, oxygen in the case of water, reacts with the metal 5, Hf, deposited on the substrate. This injection step takes place for a period of 50 to 100 milliseconds. Then a second purging step (FIG. 5), like the one preceding the second reagent injection step, is performed to eliminate the excess second reagent 9 and the gaseous reaction products 11 from the reactor.

Figure 6:
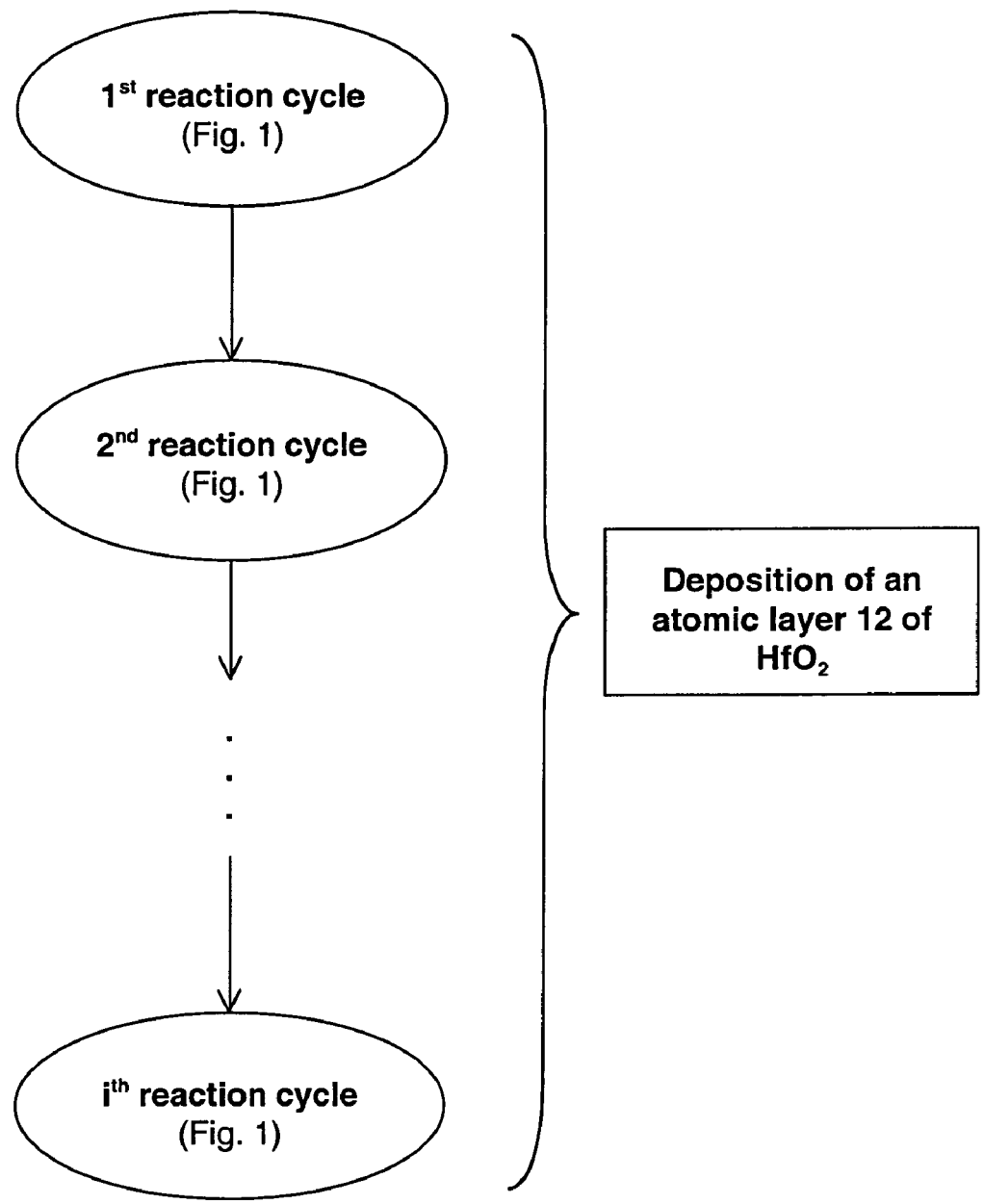
FIGS. 6 and 7 schematically and respectively represent the different steps of deposition of an atomic layer of $HfO_2$ according to the prior art and of a thin layer of $HfO_2$ according to the invention.

Although a reaction cycle theoretically enables an atomic layer 12 of $HfO_2$ to be formed, as illustrated in FIG. 6, several reaction cycles generally have to be successively performed to obtain an atomic layer 12.

In order to limit the regrowth phenomenon of the interfacial layer 3, the ALD process of a thin layer comprises, after each deposition of an atomic layer 12, at least one densification sequence of the previously deposited atomic layer 12, the time length of a densification sequence preferably being substantially longer than the time length of a reaction cycle.

Figure 7:
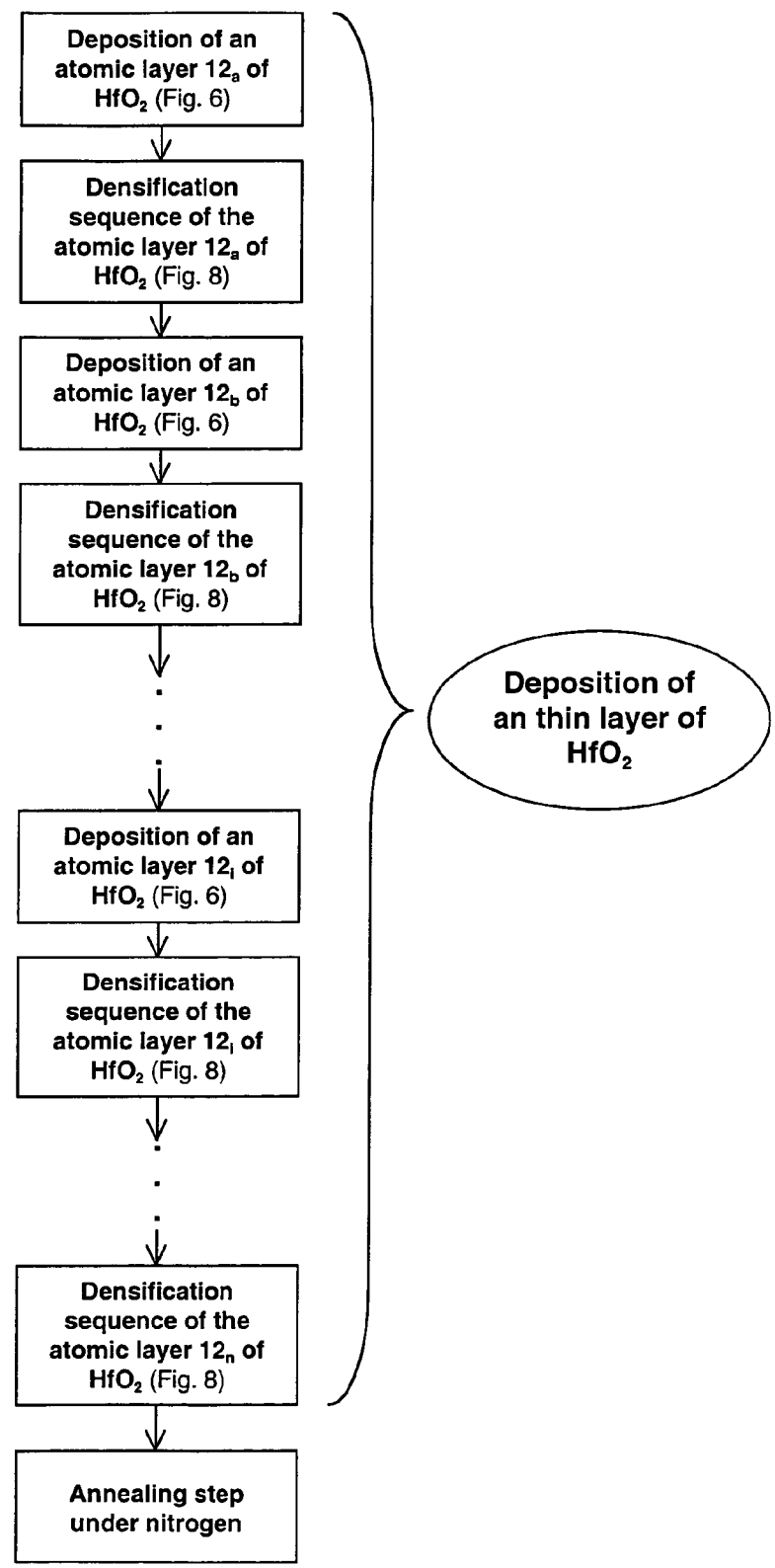

The different steps of deposition of a thin layer of $HfO_2$ are illustrated in FIG. 7. Thus, deposition of a thin layer of $HfO_2$ consists in depositing a plurality of atomic layers of $HfO_2$, $12_a$, $12_b$, ..., $12_i$, ..., $12_n$ by repetition of reaction cycles, as represented in FIG. 6, and between two deposition steps respectively of an atomic layer $12_i$ of $HfO_2$ and of an atomic layer $12_{i+1}$ of $HfO_2$, a densification sequence of the previously deposited atomic layer $12_i$ is performed so as to densify the atomic layer $12_i$. After the formation of the thin layer, said thin layer can be subjected to a high temperature annealing step, in nitrogen atmosphere, in order to stabilize the thin layer. The annealing temperature is preferably 800° C.

Figure 8:
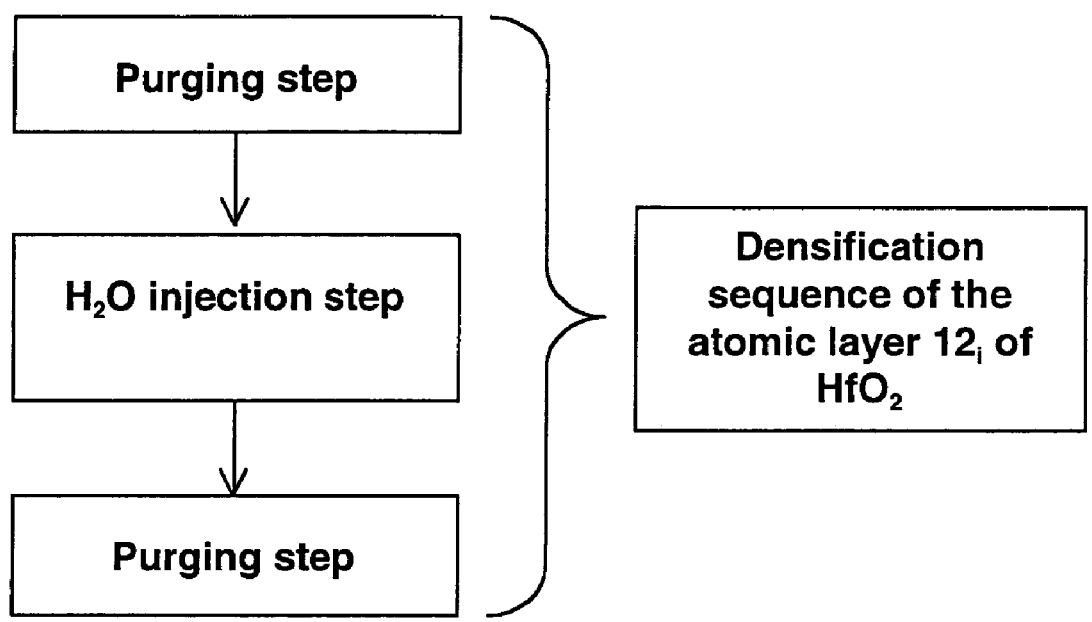
FIG. 8 schematically represents the different steps of a densification sequence of the atomic layer of $HfO_2$ deposited according to FIG. 7.

As illustrated in FIG. 8, each densification sequence successively comprises a purging step with nitrogen, an additional injection step of the second reagent 9, for example water in the case of a $HfO_2$ layer, and a purging step with nitrogen. The time length of each purging step of the densification sequence and the time length of the additional injection step are preferably substantially longer than the respective time lengths of each purging step and of the second reagent injection step of the reaction cycles. Thus, the time length of the additional injection step can be comprised between 300 milliseconds and 1000 milliseconds. The time length of the purging steps of the sequence is preferably about a few seconds whereas, in the reaction cycles, the time length of the purging steps is about a few hundred milliseconds.

For comparison purposes, two thin layers of $HfO_2$ with a thickness of 2 nm are respectively deposited on an oxidized layer of one and the same silicon substrate by a deposition process according to the invention and by a deposition process according to the prior art. By deposition process according to the prior art, what is meant is a deposition process of the ALD type, without a densification sequence between each deposition of an atomic layer, i.e. an ALD type deposition process only comprising repetition of reaction cycles.

Deposition of the thin layer according to the invention thus comprises, after each deposition of an atomic layer, a densification sequence comprising:
 a purging step with a nitrogen flow for a period of 4 seconds,
 an additional water injection step for 0.8 seconds,
 and a purging step with a nitrogen flow for a period of 4 seconds.

In both processes, respectively according to the invention and according to the prior art, the time lengths of the different steps of the reaction cycles are identical and are those conventionally used in ALD type processes.

Figure 9:
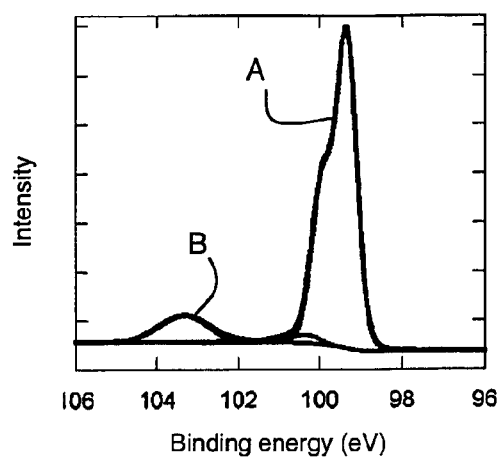
FIG. 9 represents a Si-2p core-level spectrum obtained by X-ray photoelectron spectroscopy (XPS) of a silicon substrate whereon a silicon oxide layer with a thickness of 0.7 nm is deposited.

The initial thickness of the oxidized layer of the substrate is determined by X-ray photoelectron spectroscopy also called XPS. Thus, the Si-2p core-level spectrum of the silicon substrate, obtained by XPS and represented in FIG. 9, comprises two peaks A and B. Peak A corresponds to the contribution of the silicon substrate whereas peak B, of lower intensity, corresponds to the contribution of the oxidized $SiO_2$ layer. The initial thickness of the oxidized layer, before deposition of a thin layer of $HfO_2$, is estimated at 0.65 nm±0.05, by comparing the intensity of the two peaks A and B.

The Si-2p core-level spectra obtained by XPS of the two thin layers of $HfO_2$ respectively deposited according to the prior art and according to the invention, before and after an annealing step, in nitrogen atmosphere and at 800° C., are represented in FIGS. 10 to 13. They enable the regrowth phenomenon of the oxidized layer after annealing to be evaluated.

Figure 10:
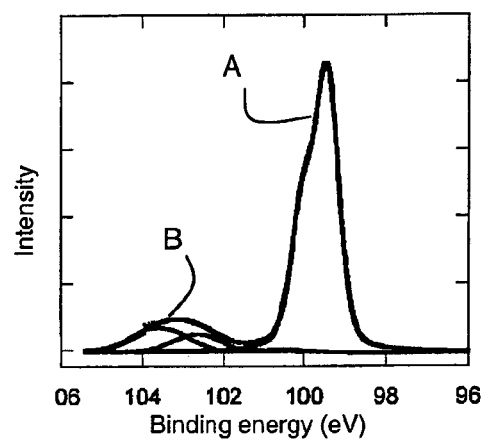
FIGS. 10 and 11 each represent a Si-2p core-level spectrum obtained by XPS of a silicon substrate according to FIG. 9 whereon a thin layer of $HfO_2$ is deposited according to the prior art, respectively before and after annealing.
Figure 11:
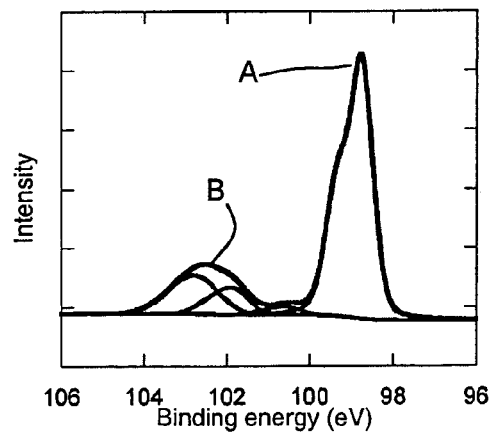

Thus, the spectra represented in FIGS. 10 and 11, corresponding to the thin layer deposited according to the prior art, indicate, after quantification, that the thickness of the oxidized interfacial layer is 0.7 nm±0.05 after deposition and 1 to 1.2 nm±0.05 after annealing.

Figure 12:
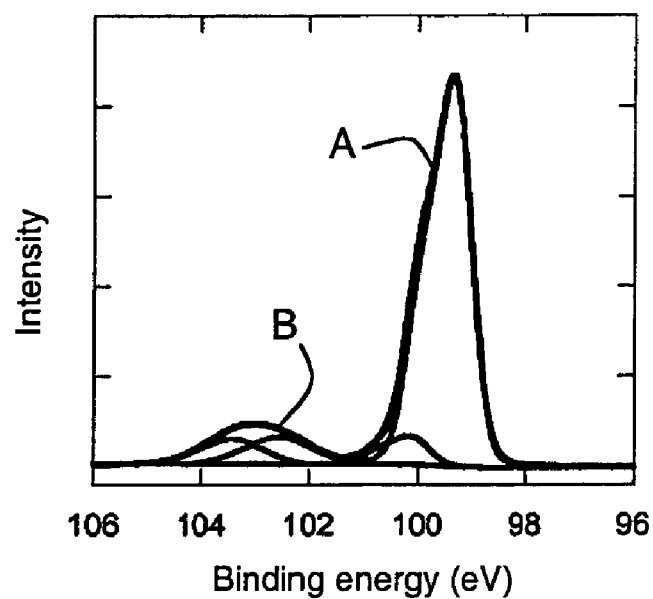
FIGS. 12 and 13 each represent a Si-2p core-level spectrum obtained by XPS of a silicon substrate according to FIG. 9 whereon $HfO_2$ is deposited according to the invention, respectively before and after annealing.
Figure 13:
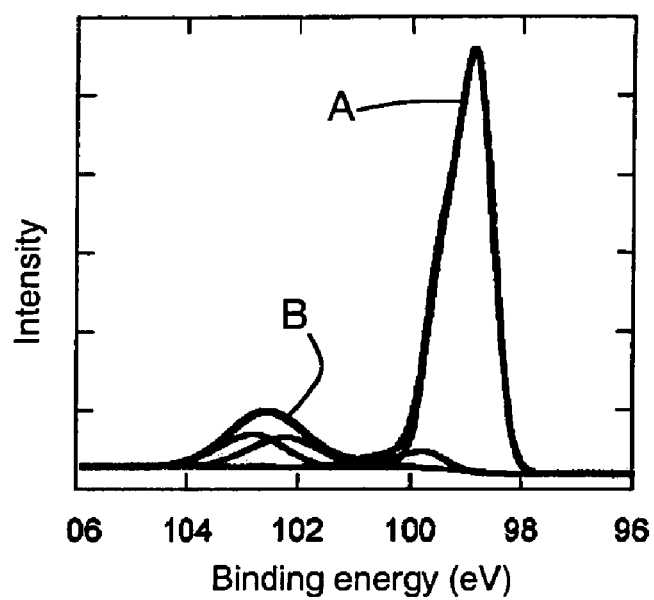

The spectra represented in FIGS. 12 and 13, corresponding to the thin layer deposited according to the invention indicate, after quantification, that the thickness of the oxidized interfacial layer remains constant, even after the annealing step in nitrogen atmosphere. It is in fact estimated at 0.6 nm±0.05 both after deposition (FIG. 12) and after annealing (FIG. 13).

A regrowth phenomenon of the oxidized interface layer is therefore observed, after annealing, when the thin layer of $HfO_2$ is deposited according to the deposition process according to the prior art, whereas with the deposition process according to the invention, the thickness of the oxidized interfacial layer is controlled.

Figure 14:
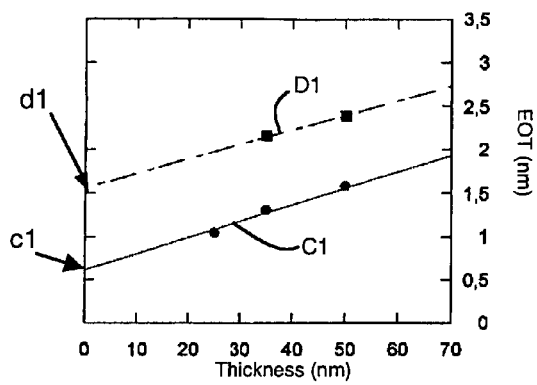
FIGS. 14 and 15 each represent the EOT variation versus the thickness of a $HfO_2$ layer respectively deposited according to the prior art and according to the invention.
Figure 15:
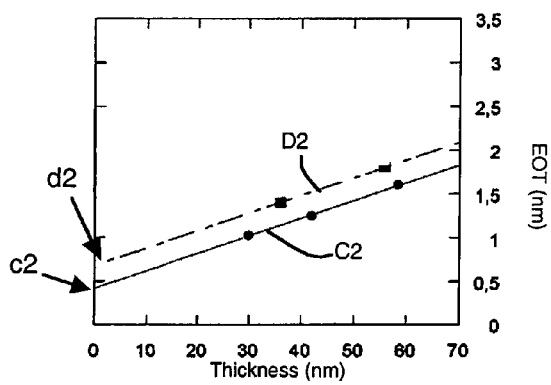

As illustrated in FIGS. 14 and 15, the regrowth phenomenon of the oxidized interfacial layer observed after the annealing step of a thin layer of $HfO_2$ deposited according to the prior art results in the benefits obtained by the introduction of the "High K" material being lost and prevents equivalent oxide thicknesses (EOT) less than or equal to 1 nm from being achieved. FIGS. 14 and 15 represent the variation of the EOT measured by mercury drop, versus the thickness of the $HfO_2$ layers respectively deposited according to the prior art and according to the invention, before and after annealing. Thus, FIG. 14 comprises two curves C1 and D1 corresponding to the variation of the EOT versus the $HfO_2$ thickness deposited according to the prior art, respectively before and after annealing, whereas FIG. 15 comprises two curves C2 and D2 corresponding to the variation of the EOT versus the $HfO_2$ thickness deposited according to the invention, respectively before and after annealing.

It can be observed that, before annealing, the curves C1 and C2 are substantially identical whereas, after annealing, the deviation between the curves C1 and D1 is greater than that between the curves C2 and D2. Thus, before annealing and for the same thickness, the EOT values are substantially identical for the layers deposited according to the prior art and according to the invention, whereas after annealing the EOT values of the layers deposited according to the prior art are higher than those of the layers deposited according to the invention. Moreover, the EOT values of the layers deposited according to the invention are hardly sensitive to annealing and the dielectric constant of the $HfO_2$ extracted from FIG. 15 is about 20 before and after annealing. The electrical response of the $HfO_2$ layers achieved according to the invention is therefore better than that of the layers achieved according to the prior art.

In addition, the ordinate at the origin of the curves C1, D1, C2 and D2 corresponds to the EOT value of the interfacial layer, before and after annealing, for a deposition process according to the prior art and according to the invention. The deposition process according to the invention enables a lower EOT value to be obtained for the interface layer, after annealing, than the deposition process according to the prior art. Indeed, before annealing, the EOT value of the interfacial layer in both the deposition processes is 0.5 nm (points c1 and c2 of curves C1 and C2), although deposition was performed on a 0.7 nm layer of silicon oxide. After annealing, the EOT value is 0.67 nm in the case of deposition according to the invention (point d2 of curve D2), whereas it reaches the value of 1.55 nm in the case of the deposition process according to the prior art (point d1 of curve D1).

Figure 16:
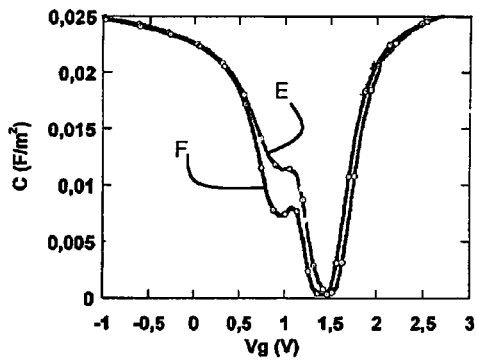
FIG. 16 represents the variation of the capacitance versus voltage of a capacitive type component fabricated on a substrate comprising a $HfO_2$ layer according to the prior art and according to the invention, for the same EOT value.
Figure 17:
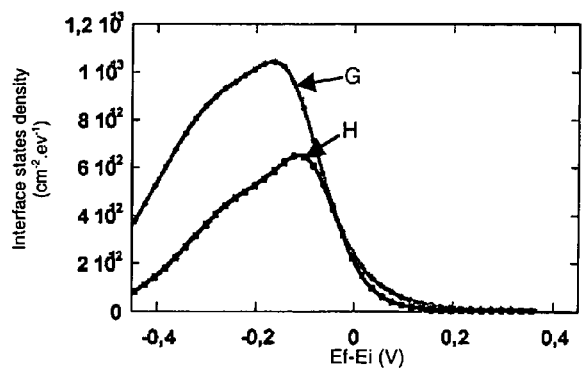
FIG. 17 represents the interface states density versus (Ef–Ei) according to FIG. 16.

In addition, other electrical parameters such as the interface states density are improved in the case of deposition according to the invention in comparison with deposition according to the prior art, as illustrated in FIGS. 16 and 17.

FIG. 16 comprises two electrical curves E and F respectively representing the variation of the capacitance versus the voltage of a component of capacitive type fabricated on a substrate comprising a HfO$_2$ layer deposited according to the prior art and according to the invention and having the same EOT value equal to 0.10 nm. Thus, for equivalent EOT values, the interface states density extracted from the curve F is lower than for the curve E. This therefore shows that a layer of HfO$_2$ deposited according to the invention leads to an interface with the substrate containing less electrical traps than a layer of HfO$_2$ deposited according to the prior art and therefore to an interface of better quality. This result can also be seen in FIG. 17 which comprises two curves G and H each representing the variation of the surface states density versus the value Ef–Ei. Ef and Ei respectively correspond to the Fermi level energy Ef and to the i state level energy, Ei varying between the valency band and the conduction band. The values of the curves G and H are respectively extracted from figures E and F.

The invention is not limited to the embodiments described above. For example, the substrate can be constituted by any type of material sensitive to oxidation; it can for example be made from germanium or silicon-germanium (SiGe). Moreover, several successive densification sequences can be performed after each atomic layer deposition.

The invention claimed is:

1. Process for deposition of a thin layer comprising at least a metal and a non-metallic chemical element on an oxidized layer of a substrate arranged in a reactor, the thin layer being formed by a plurality of superposed atomic layers, formed by repetition of a reaction cycle comprising at least the following successive steps:
   a first step of injecting a first halogenated metallic reagent into the reactor,
   a first reactor purging step,
   a second step of injecting a second reagent comprising the non-metallic chemical element into the reactor,
   a second reactor purging step, deposition process comprising, after each deposition of an atomic layer, at least one densification sequence comprising a third purging step, an additional injection step of the second reagent and a fourth purging step.

2. Process according to claim 1, wherein the time length of a densification sequence is substantially longer than the time length of a reaction cycle.

3. Process according to claim 1, wherein the time lengths of each purging step and of the additional injection step of a densification sequence are substantially longer than the respective the time lengths of each purging step and of the second injection step of a reaction cycle.

4. Process according to claim 3, wherein the time length of the additional injection step is comprised between 300 milliseconds and 1000 milliseconds whereas the time length of the second injection step is comprised between 50 milliseconds and 100 milliseconds.

5. Process according to claim 3, wherein the time length of the third and fourth purging steps is about a few seconds whereas the time length of the first and second purging steps is about a few hundred milliseconds.

6. Process according to claim 1, wherein the non-metallic chemical element of the thin layer is oxygen.

7. Process according to claim 6, wherein the second reagent is water.

8. Process according to claim 6, wherein the thin layer is formed by a metal oxide having a high dielectric constant.

9. Process according to claim 6, wherein the metal of the thin layer is selected from the group consisting of hafnium, zirconium, titanium, yttrium, praseodymium and lanthanum.

10. Process according to claim 1, wherein, after formation of a thin layer, said thin layer is subjected to an annealing step, at a temperature of 800° C., in a nitrogen atmosphere.

11. Process according to claim 1, wherein the substrate is formed by a material selected from the group consisting of silicon, germanium and silicon-germanium.

* * * * *